(12) United States Patent
Kromotis et al.

(10) Patent No.: US 9,564,566 B2
(45) Date of Patent: Feb. 7, 2017

(54) OPTOELECTRONIC COMPONENT AND METHOD FOR THE PRODUCTION THEREOF

(71) Applicant: OSRAM Opto Semiconductors GmbH, Regensburg (DE)

(72) Inventors: Patrick Kromotis, Regensburg (DE); Emanuel Hofmann, Neutraubling (DE); Ludwig Peyker, Regensburg (DE); Torsten Baade, Regensburg (DE); Simone Kiener, Regensburg (DE); Kristin Grosse, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/909,850

(22) PCT Filed: Aug. 5, 2014

(86) PCT No.: PCT/EP2014/066852
§ 371 (c)(1),
(2) Date: Feb. 3, 2016

(87) PCT Pub. No.: WO2015/018843
PCT Pub. Date: Feb. 12, 2015

(65) Prior Publication Data
US 2016/0190410 A1    Jun. 30, 2016

(30) Foreign Application Priority Data
Aug. 8, 2013 (DE) .................. 10 2013 215 650

(51) Int. Cl.
*H01L 33/62* (2010.01)
*H01L 23/31* (2006.01)
(Continued)

(52) U.S. Cl.
CPC .......... *H01L 33/62* (2013.01); *H01L 23/3135* (2013.01); *H01L 33/44* (2013.01); *H01L 33/56* (2013.01);
(Continued)

(58) Field of Classification Search
CPC ...... H01L 33/62; H01L 23/3135; H01L 33/44; H01L 33/56; H01L 2933/005; H01L 2933/0066; H01L 2924/181; H01L 2224/48091; H01L 2224/73265; H01L 2224/48247; H01L 2224/48465; H01L 2224/8592
See application file for complete search history.

(56) References Cited

U.S. PATENT DOCUMENTS 5,521,126 A      5/1996  Okamura et al.
2010/0264432 A1  10/2010 Liu et al.
(Continued)

FOREIGN PATENT DOCUMENTS

DE   11 2008 003 312 T5   10/2010
JP   2007-324256 A        12/2007
JP   2008-010591 A         1/2008

*Primary Examiner* — David Vu
(74) *Attorney, Agent, or Firm* — DLA Piper LLP (US)

(57) ABSTRACT

An optoelectronic component includes a housing having an electrically conductive first contact section, and an optoelectronic semiconductor chip arranged on the first contact section, wherein the optoelectronic semiconductor chip and the first contact section are at least partly covered by a first layer including a silicone, a second layer including $SiO_2$ is arranged at a surface of the first layer, the second layer has a thickness of 10 nm to 1 μm, and a third layer is arranged above the second layer.

11 Claims, 1 Drawing Sheet

(51) Int. Cl.
*H01L 33/44* (2010.01)
*H01L 33/56* (2010.01)
*H01L 23/24* (2006.01)

(52) U.S. Cl.
CPC ...... *H01L 23/24* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2224/8592* (2013.01); *H01L 2924/181* (2013.01); *H01L 2933/005* (2013.01); *H01L 2933/0066* (2013.01)

(56) References Cited

U.S. PATENT DOCUMENTS

2011/0006334 A1* 1/2011 Ishii ................... C09K 11/584
　　　　　　　　　　　　　　　　　　　　　257/98
2012/0007119 A1　1/2012　Shiobara et al.

* cited by examiner

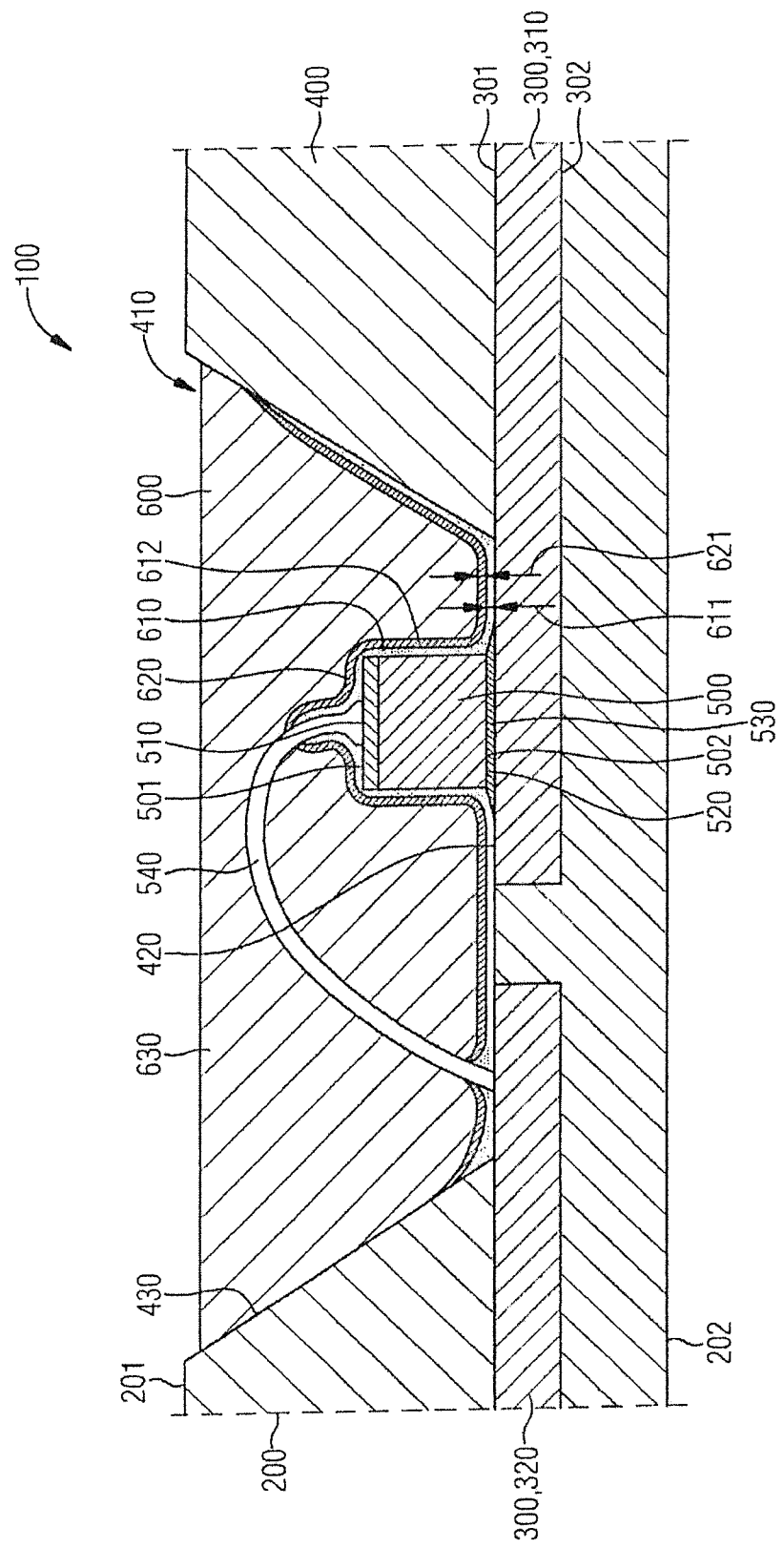

OPTOELECTRONIC COMPONENT AND METHOD FOR THE PRODUCTION THEREOF

TECHNICAL FIELD

This disclosure relates to optoelectronic components and methods of producing such components.

BACKGROUND

It is known to form optoelectronic components comprising optoelectronic semiconductor chips with housings which have embedded leadframe sections composed of copper. In the case of such optoelectronic components, the optoelectronic semiconductor chip is arranged on a leadframe section and embedded into a potting material. It is known that copper from the leadframe sections of such optoelectronic components can diffuse through the potting material to a p-n junction of the optoelectronic semiconductor chip. The diffused copper can bring about a degradation of the optoelectronic semiconductor chip.

It could therefore be helpful to provide an improved optoelectronic component and a method of producing an optoelectronic component.

SUMMARY

We provide an optoelectronic component including a housing having an electrically conductive first contact section, and an optoelectronic semiconductor chip arranged on the first contact section, wherein the optoelectronic semiconductor chip and the first contact section are at least partly covered by a first layer including a silicone, a second layer including $SiO_2$ is arranged at a surface of the first layer, the second layer has a thickness of 10 nm to 1 µm, and a third layer is arranged above the second layer.

We also provide a method of producing an optoelectronic component including providing a housing having an electrically conductive first contact; arranging an optoelectronic semiconductor chip on the first contact section; arranging a first layer including a silicone on at least parts of the optoelectronic semiconductor chip and the first contact section; forming a second layer including $SiO_2$ at a surface of the first layer, wherein forming the second layer is carried out by converting a part of the first layer; and arranging a third layer above the second layer.

BRIEF DESCRIPTION OF THE DRAWING

FIG. 1 shows a schematic sectional view of an optoelectronic component.

LIST OF REFERENCE SIGNS

100 Optoelectronic component
200 Housing
201 Top side
202 Underside
300 Leadframe
301 Top side
302 Underside
310 First contact section
320 Second contact section
400 Housing frame
410 Cavity
420 Base region
430 Wall
500 Optoelectronic semiconductor chip
501 Top side
502 Underside
510 First electrical contact pad
520 Second electrical contact pad
530 Conductive connection
540 Bond wire
600 Potting
610 First layer
611 Thickness
612 Surface
620 Second layer
621 Thickness
630 Third layer

DETAILED DESCRIPTION

Our optoelectronic component comprises a housing having an electrically conductive first contact section, and an optoelectronic semiconductor chip arranged on the first contact section. The optoelectronic semiconductor chip and the first contact section are at least partly covered by a first layer comprising a silicone. A second layer comprising $SiO_2$ is arranged at a surface of the first layer. A third layer is arranged above the second layer. Advantageously, the second layer comprising $SiO_2$ of this optoelectronic component can be a diffusion barrier. In particular, the second layer comprising $SiO_2$ can act as a diffusion barrier for copper. As a result, diffusion of copper to a p-n junction of the optoelectronic semiconductor chip can advantageously be reduced or avoided. Possible degradation of the optoelectronic semiconductor chip by diffused copper can advantageously be reduced or avoided as a result.

The first contact section may comprise copper. Advantageously, the first contact section has a high electrical conductivity as a result. Moreover, the first contact section can advantageously be electrically contacted by soldering as a result.

The housing may have a housing frame. In this case, the first contact section is embedded into the housing frame. The housing frame can comprise, for example, a plastic, for example, an epoxy resin or a ceramic. The housing frame of the optoelectronic component can be produced, for example, by a molding or a potting process by a spindle dispenser, jetter or time-pressure dispenser.

The housing may have a cavity. In this case, the first contact section is arranged in a base region of the cavity. Then, the optoelectronic semiconductor chip of the optoelectronic component can also be arranged in the cavity of the housing and protected there against damage resulting from external mechanical influences. The cavity can additionally form, for example, an optical reflector of the optoelectronic component. The first, second and third layers arranged above the first contact section and the optoelectronic semiconductor chip of the optoelectronic component can advantageously be arranged in the cavity with little technical outlay. The third layer of the optoelectronic component can mechanically protect the optoelectronic semiconductor chip. However, the third layer can also perform even further functions. By way of example, the third layer can bring about a wavelength conversion of electromagnetic radiation emitted by the optoelectronic semiconductor chip of the optoelectronic component.

The first layer may have a thickness of 1 µm to 100 µm, preferably a thickness of 5 µm to 20 µm. By way of example, the first layer of the optoelectronic component can have a thickness of 10 µm. Advantageously, the first layer is thus so thin that within the first layer a diffusion of copper can take place only to a very small extent.

The second layer may have a thickness of 10 nm to 1 µm, preferably a thickness of 50 nm to 200 nm. By way of example, the second layer of the optoelectronic component can have a thickness of 100 nm. Advantageously, the second layer of the optoelectronic component then acts as diffusion barrier for copper.

The housing may have an electrically conductive second contact section electrically insulated from the first contact section. In this case, there is an electrically conductive connection between the optoelectronic semiconductor chip and the second contact section. The electrically conductive connection between the optoelectronic semiconductor chip and the second contact section can be formed by a bond wire, for example. Advantageously, the optoelectronic semiconductor chip of the optoelectronic component can then be electrically driven via the first contact section and the second contact section.

A method of producing an optoelectronic component comprises providing a housing having an electrically conductive first contact section, arranging an optoelectronic semiconductor chip on the first contact section, arranging a first layer comprising a silicone on at least parts of the optoelectronic semiconductor chip and of the first contact section, forming a second layer comprising $SiO_2$ at a surface of the first layer, and arranging a third layer above the second layer. Advantageously, this method makes it possible to produce an optoelectronic component in which a second layer comprising $SiO_2$ acts as a diffusion barrier, in particular as diffusion barrier for copper. Owing to the integrated diffusion barrier, in the optoelectronic component obtained by the method, the risk of degradation of the optoelectronic semiconductor chip of the optoelectronic component by diffusion of copper is reduced.

Forming the second layer may be carried out by converting a part of the first layer. Advantageously, production of the second layer is possible particularly simply as a result. In particular, no dedicated process step to deposit the second layer is required to produce the second layer.

Converting the part of the first layer may be carried out by oxidation. In this case, Si contained in the first layer is converted into $SiO_2$.

Converting the part of the first layer may be carried out by a plasma treatment. A plasma treatment is advantageously suitable to convert Si contained in the first layer into $SiO_2$. In this case, the plasma acts substantially on the surface of the first layer such that the second layer is formed at the surface of the first layer.

Arranging the first layer may be carried out by potting or jetting. Advantageously, a cost-effective and reproducible process of arranging the first layer is possible as a result. The method is advantageously suitable for mass production as a result.

The above-described properties, features and advantages and the way in which they are achieved will become clearer and more clearly understood in association with the following description of the examples explained in greater detail in association with the drawing.

FIG. 1 shows a schematic sectional side view of part of an optoelectronic component 100. The optoelectronic component 100 can be a light emitting diode component, for example.

The optoelectronic component 100 comprises a housing 200. The housing 200 has a top side 201 and an underside 202 situated opposite the top side 201. The housing 200 of the optoelectronic component 100 comprises a housing frame 400 and a leadframe 300 embedded into the housing frame 400. The housing frame 400 can comprise, for example, an electrically insulating plastic material, for example, an epoxy resin, or a ceramic. The housing frame 400 can be produced, for example, by a molding process or a potting process by a spindle dispenser, jetter or time-pressure dispenser.

The leadframe 300 comprises an electrically conductive material, for example, a metal. In particular, the leadframe 300 can comprise copper. Copper affords the advantage of having good electrical conductivity and is suitable for electrical contacting by soldering.

The leadframe 300 has a top side 301 and an underside 302 situated opposite the top side 301. The leadframe 300 is subdivided into a first contact section 310 and a second contact section 320. The first contact section 310 and the second contact section 320 are physically separated from one another and electrically insulated from one another. The contact sections 310, 320 can also be referred to as leadframe sections.

The contact sections 310, 320 of the leadframe 300 are embedded into the housing frame 400 such that both the top side 301 and the underside 302 of the leadframe 300 are at least partly covered by the material of the housing frame 400. In the example illustrated, the underside 302 of the leadframe 300 is completely covered by the material of the housing frame 400. Both in the case of the first contact section 310 and the second contact section 320 of the leadframe 300, the top side 301 is partly covered by the material of the housing frame 400 and partly not covered.

The housing 200 of the optoelectronic component 100 has a cavity 410 at its top side 201. The cavity 410 is formed as a depression in the housing frame 400 at the top side 201 of the housing 200. At the top side 201 of the housing 200, the cavity 410 can have, for example, a circular disk-shaped or rectangular cross section. In the sectional illustration in FIG. 1 here the cavity 410 tapers in the shape of a truncated pyramid proceeding from the top side 201 of the housing 200. However, the cavity 410 could also have a cylindrical shape or some other shape.

The cavity 410 of the housing 200 of the optoelectronic component 100 has a base region 420 and a circumferential wall 430. The wall 430 is formed by the material of the housing frame 400. The wall 430 forms a lateral surface of the cavity 410. The wall 430 of the cavity 410 of the housing 200 of the optoelectronic component 100 can form a reflector that concentrates electromagnetic radiation emitted by the optoelectronic component 100. The base region 420 forms a base surface of the cavity 410. Parts of the top side 301 of the first contact section 310 and of the second contact section 320 of the leadframe 300 are exposed in the base region 420 of the cavity 410 of the housing 200.

The optoelectronic component 100 furthermore comprises an optoelectronic semiconductor chip 500. The optoelectronic semiconductor chip 500 can be a light emitting diode chip (LED chip), for example. The optoelectronic semiconductor chip 500 has a top side 501 and an underside 502 situated opposite the top side 501. The top side 501 of the optoelectronic semiconductor chip 500 forms a radiation emission face of the optoelectronic semiconductor chip 500. The optoelectronic semiconductor chip 500 emits electromagnetic radiation, for example, visible light, at its top side 501 forming the radiation emission face.

A first electrical contact pad 510 of the optoelectronic semiconductor chip 500 is formed at the top side 501 of the optoelectronic semiconductor chip 500. A second electrical contact pad 520 is formed at the underside 502 of the optoelectronic semiconductor chip 500. Via the first electrical contact pad 510 and the second electrical contact pad 520, an electrical voltage can be applied to the optoelectronic semiconductor chip 500 to cause the optoelectronic semiconductor chip 500 to emit electromagnetic radiation.

The optoelectronic semiconductor chip 500 is arranged in the cavity 410 of the housing 200 of the optoelectronic component 100. The optoelectronic semiconductor chip 500 is arranged in the base region 420 of the cavity 410 at the top side 301 of the first contact section 310 of the leadframe 300. In this case, the underside 502 of the optoelectronic semiconductor chip 500 faces the top side 301 of the first contact section 310. The optoelectronic semiconductor chip 500 connects to the first contact section 310 by a conductive connection 530. The conductive connection 530 produces an electrically conductive contact between the second electrical contact pad 520 of the optoelectronic semiconductor chip 500 at the underside 502 of the optoelectronic semiconductor chip 500 and the first contact section 310. The conductive connection 530 can be formed by a solder, for example.

The first electrical contact pad 510 of the optoelectronic semiconductor chip 500, the first electrical contact pad being formed at the top side 501 of the optoelectronic semiconductor chip 500, electrically conductively connects to the second contact section 320 of the leadframe 300 of the housing 200 of the optoelectronic component 100 by a bond wire 540. In this case, the bond wire 540 preferably runs completely within the cavity 410 of the housing 200. Instead of the bond wire 540, some other electrically conductive connection between the first electrical contact pad 510 of the optoelectronic semiconductor chip 500 and the second contact section 320 of the housing 200 of the optoelectronic component 100 can also be provided.

The optoelectronic semiconductor chip 500, the base region 420 and parts of the wall 430 of the cavity 410 of the housing 200 of the optoelectronic component 100 are covered by a first layer 610. In this case, the first layer 610 preferably covers the entire top side 501 of the optoelectronic semiconductor chip 500 and the side surfaces of the optoelectronic semiconductor chip 500 that extend between the top side 501 and the underside 502 of the optoelectronic semiconductor chip 500. Moreover, the first layer 610 preferably covers the parts of the top side 301 of the first contact section 310 and of the second contact section 320 of the leadframe 300 which are exposed in the base region 420 of the cavity 410 of the housing 200. The first layer 610 preferably forms a continuous and closed layer.

The first layer 610 comprises a silicone. The first layer 610 may have been applied by potting or by jetting, for example. In this case, jetting denotes a method in which the material of the first layer 610 is applied under pressure through a nozzle. Preferably, the first layer 610 was applied after the arrangement of the optoelectronic semiconductor chip 500 in the cavity 410 and after the arrangement of the bond wire 540.

The first layer 610 has a thickness 611. The thickness 611 is preferably 1 µm to 100 µm. The thickness 611 of the first layer 610 is particularly preferably 5 µm to 20 µm. By way of example, the first layer 610 can have a thickness 611 of 10 µm. Therefore, the first layer 610 has a small thickness in comparison with the dimensions of the optoelectronic semiconductor chip 500 and of the cavity 410 of the housing 200.

A second layer 620 is arranged at a surface 612 of the first layer 610. The second layer 620 comprises $SiO_2$. The second layer 620 has a thickness 621. The thickness 621 of the second layer 620 is preferably 10 nm to 1 µm. The thickness 621 of the second layer 620 is particularly preferably 50 nm to 200 nm. By way of example, the second layer 620 can have a thickness 621 of 100 nm.

The second layer 620 was preferably formed by conversion of a part of the first layer 610 arranged at the surface 612 of the first layer 610. A part of the material of a part of the first layer 610 was oxidized. Si from the first layer 610 was converted into $SiO_2$. Preferably, conversion of the part of the first layer 610 arranged at the surface 612 of the first layer 610 is carried out by a plasma treatment. The process of forming the second layer 620 by converting a part of the material of the first layer 610 can also be referred to as vitrification.

A third layer 630 is arranged above the second layer 620. Preferably, the third layer 630 substantially completely fills the cavity 410. In this case, the third layer 630 can have a thickness significantly greater than the thickness 611 of the first layer 610 and the thickness 621 of the second layer 620. Preferably, the optoelectronic semiconductor chip 500 and the bond wire 540 are embedded substantially completely into the material of the third layer 630. As a result, the third layer 630 protects the optoelectronic semiconductor chip 500 and the bond wire 540 against damage resulting from external mechanical influences.

The third layer 630 can comprise a silicone and may have been introduced into the cavity 410 by potting, for example. The third layer 630 can also comprise embedded wavelength-converting particles to convert a wavelength of the electromagnetic radiation emitted by the optoelectronic semiconductor chip 500. For this purpose, the embedded wavelength-converting particles can absorb electromagnetic radiation having a first wavelength and subsequently emit electromagnetic radiation having a second, typically longer, wavelength. The wavelength-converting particles can comprise, for example, an organic phosphor or an inorganic phosphor. The wavelength-converting particles can also comprise quantum dots.

The first layer 610, the second layer 620 and the third layer 630 jointly form a potting material 600 of the optoelectronic component 100.

The second layer 620 comprising $SiO_2$ of the potting material 600 of the optoelectronic component 100 forms a diffusion barrier. In particular, the second layer 620 forms a diffusion barrier for copper. Copper released from the contact sections 310, 320 of the leadframe 300 of the housing 200 of the optoelectronic component 100 cannot penetrate through the second layer 620 or can penetrate through it only to a small extent. This prevents copper released from the contact sections 310, 320 of the leadframe 300 from being able to diffuse through the potting material 600 to a p-n junction of the optoelectronic semiconductor chip 500 that is arranged near the top side 501 of the optoelectronic semiconductor chip 500. Diffusion of copper to the p-n junction of the optoelectronic semiconductor chip 500 could contribute to degradation of the optoelectronic semiconductor chip 500. The diffusion barrier formed by the second layer 620 prevents or reduces such degradation of the optoelectronic semiconductor chip 500 caused by the diffusion of copper.

Our components and methods have been illustrated and described in greater detail on the basis of the preferred examples. Nevertheless, this disclosure is not restricted to the examples discussed. Moreover, other variations can be derived therefrom by those skilled in the art, without departing from the scope of protection of the appended claims.

This application claims priority of DE 10 2013 215 650.2, the disclosure of which is hereby incorporated by reference.

The invention claimed is:

1. An optoelectronic component comprising:
a housing having an electrically conductive first contact section; and
an optoelectronic semiconductor chip arranged on the first contact section,
wherein the optoelectronic semiconductor chip and the first contact section are at least partly covered by a first layer comprising a silicone,
a second layer comprising $SiO_2$ is arranged at a surface of the first layer,
the second layer has a thickness of 10 nm to 1 µm, and
a third layer is arranged above the second layer.

2. The optoelectronic component as claimed in claim 1, wherein the first contact section comprises copper.

3. The optoelectronic component as claimed in claim 1, wherein the housing has a housing frame, and
the first contact section is embedded into the housing frame.

4. The optoelectronic component as claimed in claim 1, wherein the housing has a cavity, and
the first contact section is arranged in a base region of the cavity.

5. The optoelectronic component as claimed in claim 1, wherein the first layer has a thickness of 1 µm to 100 µm.

6. The optoelectronic component as claimed in claim 1, wherein the second layer has a thickness of 50 nm to 200 nm.

7. The optoelectronic component as claimed in claim 1, further comprising:
an electrically conductive connection between the optoelectronic semiconductor chip and the second contact section,
wherein the housing has an electrically conductive second contact section electrically insulated from the first contact section.

8. A method of producing an optoelectronic component comprising:
providing a housing having an electrically conductive first contact section;
arranging an optoelectronic semiconductor chip on the first contact section;
arranging a first layer comprising a silicone on at least parts of the optoelectronic semiconductor chip and the first contact section;
forming a second layer comprising $SiO_2$ at a surface of the first layer, wherein forming the second layer is carried out by converting a part of the first layer; and
arranging a third layer above the second layer.

9. The method as claimed in claim 8, wherein converting the part of the first layer is carried out by oxidation.

10. The method as claimed in claim 8, wherein converting the part of the first layer is carried out by a plasma treatment.

11. The method as claimed in claim 8, wherein arranging the first layer is carried out by potting or jetting.

* * * * *